United States Patent
Lee et al.

(10) Patent No.: US 9,747,973 B2
(45) Date of Patent: Aug. 29, 2017

(54) SOLID STATE STORAGE DEVICE AND DATA WRITING METHOD TO PREVENT DATA LOSS DURING PROGRAM CYCLE

(71) Applicants: Lite-On Electronics (Guangzhou) Limited, Guangzhou (CN); LITE-ON TECHNOLOGY CORPORATION, Taipei (TW)

(72) Inventors: Ming-Hsuan Lee, Taipei (TW); Sen-Ming Chuang, Taipei (TW); Jen-Cheng Liu, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/992,285

(22) Filed: Jan. 11, 2016

(65) Prior Publication Data
US 2017/0103806 A1 Apr. 13, 2017

(30) Foreign Application Priority Data
Oct. 8, 2015 (TW) .............................. 104133189 A

(51) Int. Cl.
*G11C 11/34* (2006.01)
*G11C 11/56* (2006.01)

(52) U.S. Cl.
CPC ................................ *G11C 11/5628* (2013.01)

(58) Field of Classification Search
None
See application file for complete search history.

(56) References Cited

U.S. PATENT DOCUMENTS

2001/0049799 A1* 12/2001 Morita ................ G06F 11/1008
714/6.22
2010/0235568 A1* 9/2010 Inamura .................... G06F 1/30
711/103
(Continued)

FOREIGN PATENT DOCUMENTS

CN 104050107 A 9/2014
TW 201117001 A 5/2011

OTHER PUBLICATIONS

Taiwan Intellectual Property Office, "Office Action", issued on Sep. 22, 2016.

*Primary Examiner* — Son Dinh
*Assistant Examiner* — Sultana Begum
(74) *Attorney, Agent, or Firm* — WPAT, PC

(57) ABSTRACT

A data writing method for a solid state storage device includes following steps. A step (a) is performed to judge whether a shutdown command is issued from a host. In a step (b), if the solid state storage device confirms that the shutdown command is not issued from the host, plural program procedures are performed. Consequently, plural write data in a buffer are stored to a triple-level cell flash memory according to a program order. In a step (c), if the solid state storage device confirms that the shutdown command is issued from the host, plural redundant data are added to the plural write data, the write data are stored into the buffer, and the plural program procedures are performed. Consequently, the plural write data in the buffer are stored to the triple-level cell flash memory according to the program order.

13 Claims, 9 Drawing Sheets

(56) References Cited

U.S. PATENT DOCUMENTS

| | | |
|---|---|---|
| 2011/0113184 A1 | 5/2011 | Chu |
| 2014/0269056 A1 | 9/2014 | Chang et al. |
| 2015/0106557 A1* | 4/2015 | Yu .................. G06F 12/0246 |
| | | 711/103 |
| 2015/0193302 A1* | 7/2015 | Hyun .................. G11C 29/52 |
| | | 714/764 |
| 2016/0147482 A1* | 5/2016 | Jang .................. G06F 3/0679 |
| | | 711/103 |

* cited by examiner

SOLID STATE STORAGE DEVICE AND DATA WRITING METHOD TO PREVENT DATA LOSS DURING PROGRAM CYCLE

This application claims the benefit of Taiwan Patent Application No. 104133189, filed Oct. 8, 2015, the subject matter of which is incorporated herein by reference.

FIELD OF THE INVENTION

The present invention relates to a solid state storage device and a control method thereof, and more particularly to a solid state storage device with a triple-level cell (TLC) flash memory and a data writing method thereof.

BACKGROUND OF THE INVENTION

As is well known, a solid state storage device is a data storage device that uses a NAND-based flash memory to store data. The NAND-based flash memory is a non-volatile memory. After data are written to the flash memory, if the system is powered off, the data are still retained in the flash memory.

Generally, each cell of the flash memory has a floating gate transistor. During a program cycle of the flash memory, hot carriers are injected into the floating gate of the floating gate transistor. By controlling the amount of hot carriers to be injected into the floating gate, the threshold voltage of the floating gate transistor can be changed. Consequently, the storing state of the cell is determined according to the threshold voltage. During an erase cycle, the hot carriers are ejected from the floating gate of the floating gate transistor.

Depending on different designs, the flash memories may be classified into several types, including single-level cell flash memories and multi-level cell flash memories. The multi-level cell flash memories include double-level cell flash memories, triple-level cell flash memories or more-level cell flash memories.

FIG. 1 schematically illustrates the threshold voltage distribution curves of the various flash memories in different storing states. The single-level cell flash memory can store only one bit of data per cell (i.e., 1 bit/cell). According to the amount of the hot carriers injected into the cell, there are two storing states of each cell of the single-level cell flash memory corresponding to two threshold voltage distribution curves. For example, the cell with the lower threshold voltage is the storing state "0", and the cell with the higher threshold voltage is the storing state "1". The storing state "0" and the storing state "1" are two different storing states. Moreover, the storing state "0" is also indicated as a first storing state, and the storing state "1" is also indicated as a second storing state. For example, the cell with the threshold voltage of approximately 0V is the first storing state, and the cell with the threshold voltage of approximately 10V is the second storing state.

The double-level cell flash memory can store two bits of data per cell (i.e., 2 bits/cell). According to the amount of the hot carriers injected into the cell, each cell of the double-level cell flash memory has four storing states corresponding to four threshold voltage distribution curves. According to the threshold voltages in ascending order, the storing states of the cells include the storing state "00", the storing state "01", the storing state "10" and the storing state "11".

The triple-level cell flash memory can store three bits of data per cell (i.e., 3 bits/cell). According to the amount of the hot carriers injected into the cell, each cell of the triple-level cell flash memory has eight storing states corresponding to eight threshold voltage distribution curves. According to the threshold voltages in ascending order, the storing states of the cells include the storing state "000", the storing state "001", the storing state "010", the storing state "011", the storing state "100", the storing state "101", the storing state "110" and the storing state "111".

That is, during the program cycle of the flash memory, the threshold voltage and the storing state of the cell are correspondingly changed by controlling the amount of the hot carriers injected into the cell. For programming the single-level cell flash memory, a single program procedure is required to program the cells to the desired storing states. However, for programming the multi-level cell flash memory, many program procedures are required to program the cells to the desired storing states.

FIG. 2A schematically illustrates an approach of programming a double-level cell flash memory. In FIG. 2A, two program procedures are performed to program the cell of the double-level cell flash memory to the storing state "10". Firstly, in the first program procedure, the cell is programmed to the storing state "11" in response to a first program voltage. Then, in the second program procedure, the cell is programmed to the storing state "10" in response to a second program voltage.

Similarly, for programming the cell of the double-level cell flash memory to the storing state "01", the cell is programmed to the storing state "00" in the first program procedure, and the cell is programmed to the storing state "01" in the second program procedure.

Generally, the flash memory comprises plural blocks. Each block contains plural pages. During the program cycle, data are written into at least one page of the flash memory. The size of the page is defined by the manufacturer of the flash memory. For example, the size of each page is 2K bytes, 4K bytes or 8K bytes. For example, the write data of the 4K bytes page contain user data, encoding data and associated data and have a total of 4224 bytes (=4224×8 bits).

In other words, a total of 4224×8 cells of the single-level cell flash memory are required to store the data of a 4K bytes page. Since the data density of the double-level cell flash memory is higher, a total of 4224×8 cells of the double-level cell flash memory can store two pages of data (=2×4224 bytes). Similarly, a total of 4224×8 cells of the triple-level cell flash memory can store three pages of data (=3×4224 bytes).

FIGS. 2B and 2C schematically illustrate the uses of 4224×8 double-level cells of the flash memory to store two pages of data. Take the first byte (Byte-1) as an example. During the program cycle, the write data 0x65h (001100101b) is stored in the first byte of the page M, and the write data 0xDBh (11011011b) is stored in the first byte of the page N.

Please refer to FIG. 2B. In the first program procedure, the write data (01100101b) of the first byte of the page M is programmed to eight cells of the flash memory. Consequently, the storing states of the eight cells are "00", "11", "11", "00", "00", "11", "00" and "11", respectively. After the first program procedure, the write data of the first byte of the page M is 01100101b, and the write data of the first byte of the page N is also 01100101b.

Please refer to FIG. 2C. In the second program procedure, the write data (11011011b) of the first byte of the page N is programmed to eight cells of the flash memory. Consequently, the storing states of the eight cells are changed to "01", "11", "10", "01", "01", "10", "01" and "11", respectively. After the second program procedure, the write data of the first byte of the page M is 01100101b, and the write data of the first byte of the page N becomes 11011011b.

In other words, after the first program procedure, the 4224×8 cells can only store the data of the page M. After the second program procedure, the 4224×8 cells can store the data of the page M page and the data of the page N.

According to the specifications of the multi-level cell flash memories, the double-level cell flash memory comprises upper pages and lower pages. The page M of FIG. 2B is one of the upper pages, and the page N of FIG. 2C is one of the lower pages. In other words, the first program procedure is an upper page program procedure, and the second program procedure is a lower page program procedure. After both of the upper page program procedure and the lower page program procedure are completed, the data of the double-level cell flash memory can be read.

Similarly, the triple-level cell flash memory comprises upper pages, middle pages and lower pages. During the program cycle, three program procedures are required to program the upper page, the middle page and the lower page, respectively.

However, according to the specifications of the triple-level cell flash memory, the same three-level cells cannot be programmed by three consecutive program procedures. Consequently, the triple-level cell flash memory has the risk of losing data during the program cycle.

SUMMARY OF THE INVENTION

An embodiment of the present invention provides a data writing method for a solid state storage device. The data writing method includes the following steps. Firstly, a step (a) is performed to judge whether a shutdown command is issued from a host. In a step (b), if the solid state storage device confirms that the shutdown command is not issued from the host, plural program procedures are performed. Consequently, plural write data in a buffer are stored to a flash memory according to a program order. In a step (c), if the solid state storage device confirms that the shutdown command is issued from the host, plural redundant data are added to the plural write data, the write data are stored into the buffer, and the plural program procedures are performed. Consequently, the plural write data in the buffer are stored to the flash memory according to the program order. The flash memory stores more than 2 bits per cell.

Another embodiment of the present invention provides a solid state storage device. The solid state storage device is connected with a host. The solid state storage device includes a controller, a buffer and a flash memory. The controller is connected with the host. The buffer is connected with the controller. The flash memory is connected with the controller. When the host issues a shutdown command, the controller adds plural redundant data as write data into the buffer. The controller performs plural program procedures, so that the plural write data in the buffer are stored to the flash memory according to a program order. The flash memory stores more than 2 bits per cell.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
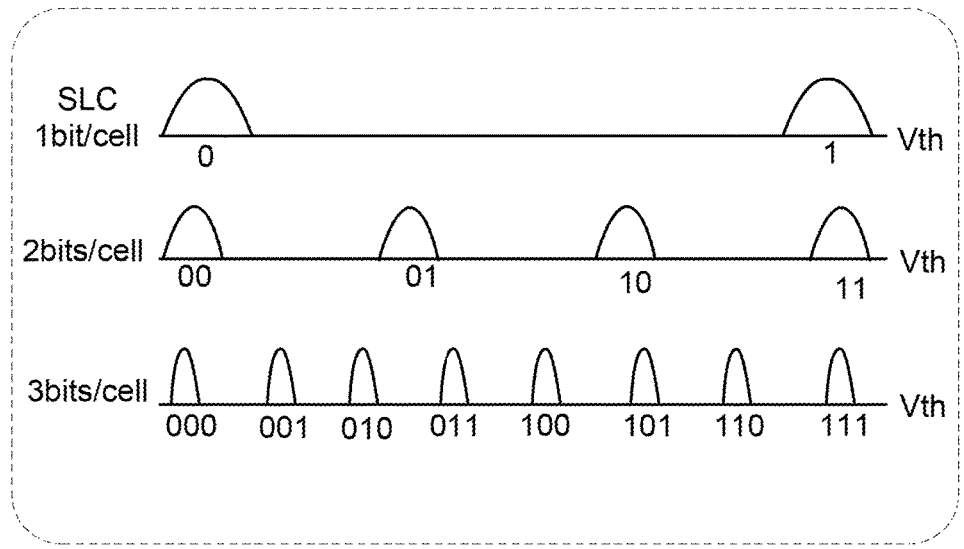
FIG. 1 (prior art) schematically illustrates the threshold voltage distribution curves of the various flash memories in different storing states.
Figure 2A:
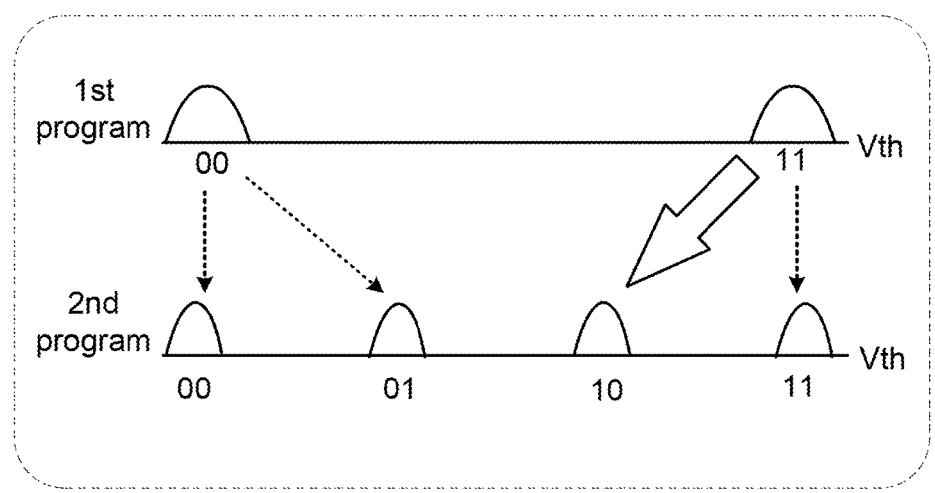
FIG. 2A (prior art) schematically illustrates an approach of programming a double-level cell flash memory.
Figure 2B:
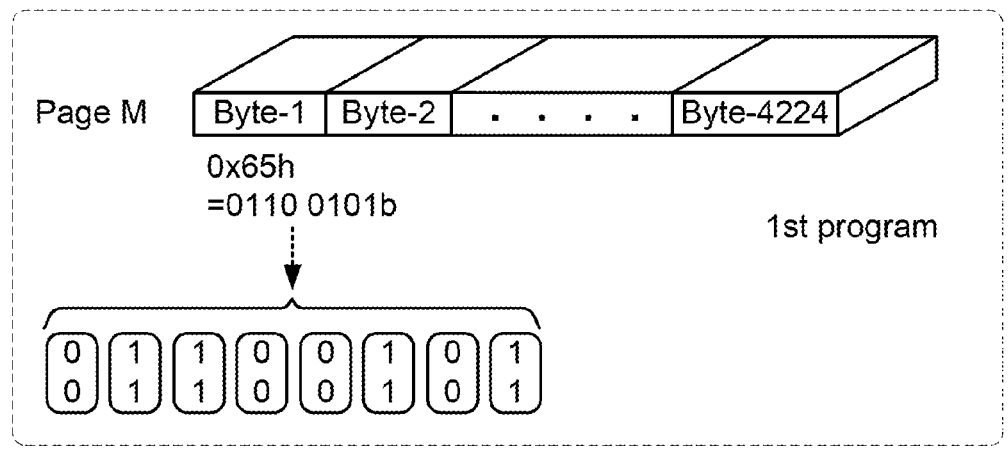
FIGS. 2B and 2C (prior art) schematically illustrate the uses of 4224×8 double-level cells of the flash memory to store two pages of data.
Figure 2C:
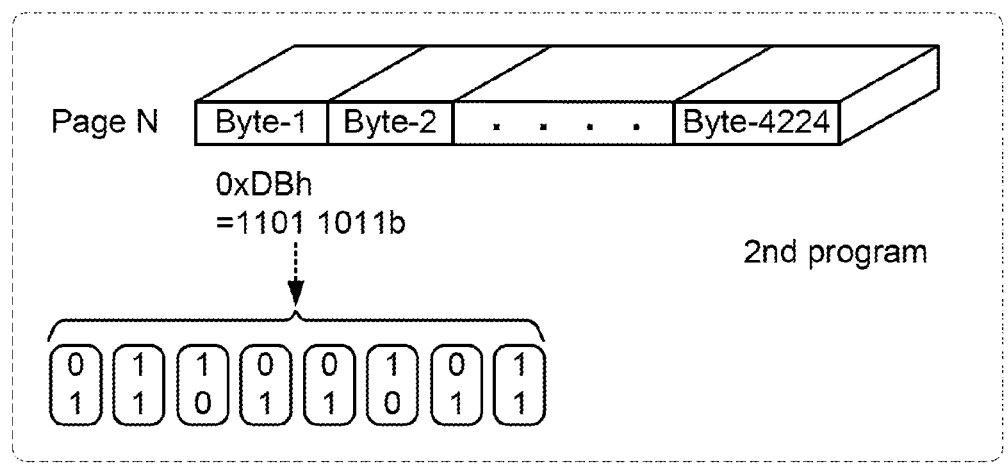
Figure 3:
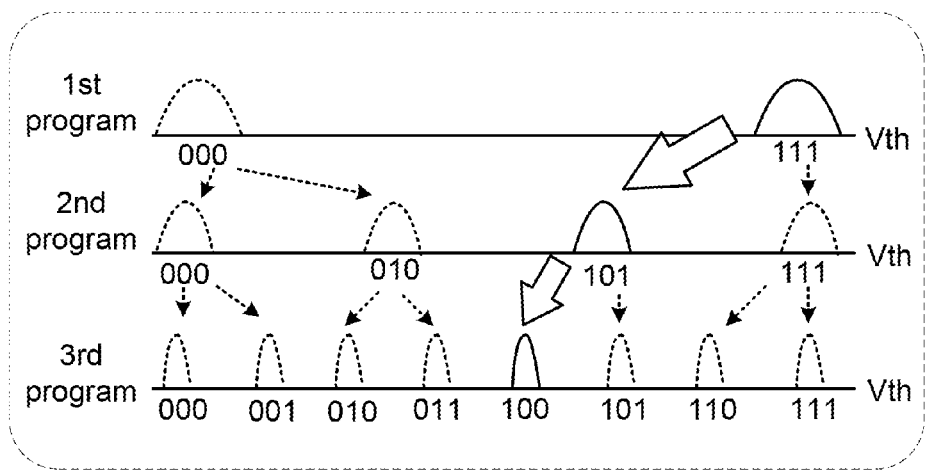
FIG. 3 schematically illustrates an approach of programming a triple-level cell flash memory.

FIG. 3 schematically illustrates an approach of programming a triple-level cell flash memory. The triple-level cell flash memory is also referred as a TLC flash memory. In FIG. 3, three program procedures are performed to program the cell of the TLC flash memory to the storing state "100". Firstly, in the first program procedure, the cell is programmed to the storing state "111". Then, in the second program procedure, the cell is programmed to the storing state "101". Then, in the third program procedure, the cell is programmed to the storing state "100".

In other words, it is necessary to realize the final storing state of the TLC flash memory during the program cycle. For programming the cell of the triple-level cell flash memory to the storing state "011", the cell is programmed to the storing state "000" in the first program procedure, then the cell is programmed to the storing state "010" in the second program procedure, and finally the cell is programmed to the storing state "011" in the third program procedure. The ways of programming the triple-level cell flash memory to other storing states are similar, and are not redundantly described herein.

According to the specifications, the TLC flash memory comprises upper pages, middle pages and lower pages. During the program cycle, three program procedures are required to program the upper page, the middle page and the lower page, respectively. The program cycle of the TLC flash memory will be illustrated as follows.

Figure 4A:
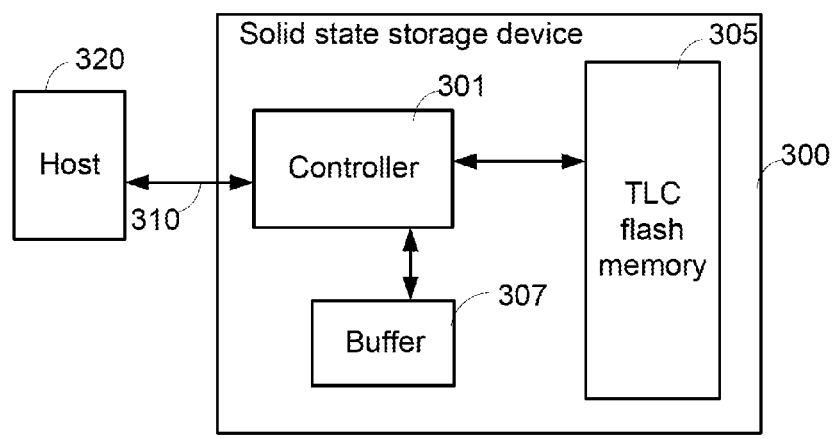
FIG. 4A is a schematic functional block diagram illustrating a solid state storage device according to an embodiment of the present invention.

FIG. 4A is a schematic functional block diagram illustrating a solid state storage device according to an embodiment of the present invention. As shown in FIG. 4A, the solid state storage device 300 comprises a controller 301, a buffer 307 and a TLC flash memory 305. The controller 301 is connected with the buffer 307 and the TLC flash memory 305. Moreover, the controller 301 is connected with a host 320 through an external bus 310. Consequently, commands and data can be exchanged between the controller 301 and the host 320. For example, the buffer 307 is a static random access memory (SRAM) or a dynamic random access memory (DRAM). When the supplied power is interrupted, the data temporarily stored in the buffer 307 are not retained therein. Generally, the external bus 310 is a USB bus, an IEEE 1394 bus, a PCIe bus, a SATA bus, or the like.

A process of writing host data from the host 320 to the TLC flash memory 305 will be illustrated as follows. Firstly, the controller 301 performs an error correction code (ECC) encoding operation to encode the host data into write data, and stores the write data into the buffer 307. Then, the controller 301 performs the program cycle at proper time in order to store the write data in the buffer 307 into the TLC flash memory 305.

Figure 4B:
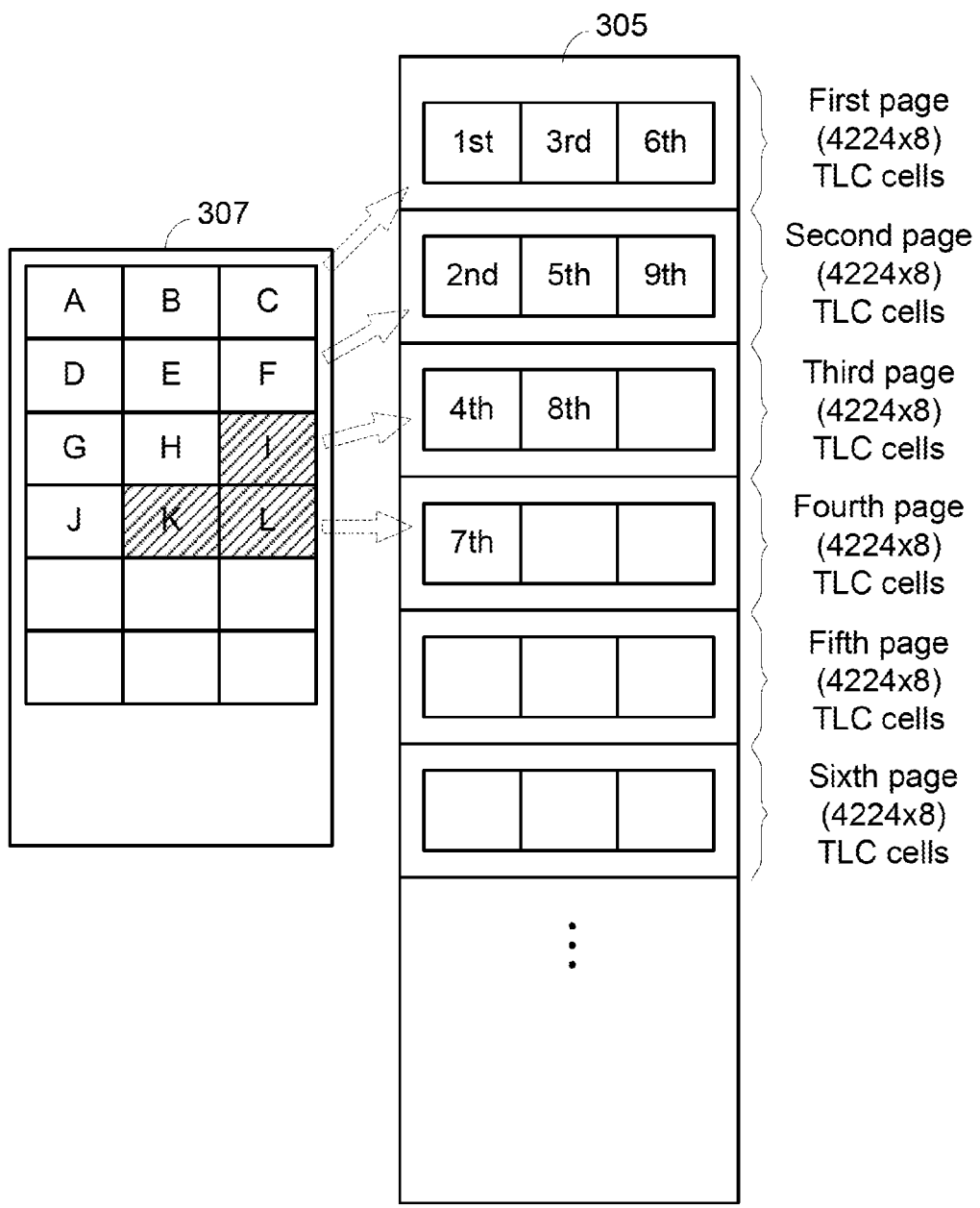
FIG. 4B schematically illustrates the program order of the TLC flash memory of FIG. 4A.

Moreover, according to the specifications, the program order of the TLC flash memory 305 is determined. FIG. 4B schematically illustrates the program order of the TLC flash memory of FIG. 4A. For example, the size of the page is 4K bytes. In addition, the write data of the 4K bytes page contain user data, encoding data and associated data and have a total of 4224 bytes (=4224×8 bits).

As shown in FIG. 4B, the TLC flash memory 305 comprises plural pages. Each page has a total of 4224×8 TLC cells. After the host data with 12 pages are received by the solid state storage device 300 and the ECC encoding operation is performed on the host data, 12 pages A~L of the write data are temporarily stored in the buffer 307 sequentially.

As shown in FIG. 4B, the write data of the pages A, B and C are stored in the first page TLC cells, the write data of the pages D, E and F are stored in the second page TLC cells, the write data of the pages G, H and I are stored in the third page TLC cells, and the write data of the pages J, K and L are stored in the fourth page TLC cells.

According to the specifications, the program order of the TLC flash memory 305 is shown in FIG. 4B. Firstly, the first page TLC cells are activated, and a first program procedure is performed on the upper page of the first page TLC cells. Then, the second page TLC cells are activated, and a second program procedure is performed on the upper page of the second page TLC cells. Then, the first page TLC cells are activated, and a third program procedure is performed on the middle page of the first page TLC cells. Then, the third page TLC cells are activated, and a fourth program procedure is performed on the upper page of the third page TLC cells. Then, the second page TLC cells are activated, and a fifth program procedure is performed on the middle page of the second page TLC cells. Then, the first page TLC cells are activated, and a sixth program procedure is performed on the lower page of the first page TLC cells. Then, the fourth page TLC cells are activated, and a seventh program procedure is performed on the upper page of the fourth page TLC cells. Then, the third page TLC cells are activated, and an eighth program procedure is performed on the middle page of the third page TLC cells. Then, the second page TLC cells are activated, and a ninth program procedure is performed on the lower page of the second page TLC cells.

The program order of FIG. 4B complies with the following rule. That is, after the upper page program procedure of a specified page is performed, the middle page program procedure of the preceding page and the lower page program procedure of the preceding two pages are sequentially performed. After the first program procedure, the third program procedure and the sixth program procedure are completed, the first page TLC cells have been completely programmed. Similarly, after the second program procedure, the fifth program procedure and the ninth program procedure are completed, the second page TLC cells have been completely programmed.

Since no new host data are provided by the host 320, no new write data are added to the buffer 307. Due to the limitation of the program order of the TLC flash memory 305, the controller 301 cannot perform the middle page program procedure on the fourth page TLC cells and cannot perform the lower page program procedure on the third page TLC cells because the controller 301 cannot perform the upper page program procedure on the fifth page TLC cells. Similarly, the controller 301 cannot perform the lower page program procedure on the fourth page TLC cells. Consequently, the write data of three pages I, K and L which are temporarily stored in the buffer 307 cannot be written to the TLC flash memory 305.

After the TLC cells of one page have been completely programmed by three program procedures, the stored data therein are stable data. The stable data can be accurately read by the controller 301 through an ECC decoding procedure. On the other hand, if the TLC cells of one page have not been completely programmed by the three program procedures, the stored data therein are unstable data. The unstable data cannot be accurately read by the controller 301 through the ECC decoding procedure.

Please refer to FIG. 4B again. Since the third page TLC cells and the fourth page TLC cells are not completely programmed, the data in the third page TLC cells and the fourth page TLC cells are unstable data. After new host data from the host 320 are received, the controller 301 continuously performs the program procedures according to the program order of the TLC flash memory 305. Consequently, the data in the third page TLC cells and the fourth page TLC cells become the stable data.

As mentioned above, the data temporarily stored in the buffer 307 (e.g., SRAM or DRAM) are lost when the supplied power is interrupted. When the host 320 issues a shutdown command to the solid state storage device 300, the write data of the three pages I, K and L which are temporarily stored in the buffer 307 will be lost because of the limitation of the program order and the power interruption.

After the solid state storage device 300 is powered on again, the data in the third page TLC cells and the fourth page TLC cells are lost because the third page TLC cells and the fourth page TLC cells have not been completely programmed and the unstable data cannot be accurately read by the controller 301 through the ECC decoding procedure.

Figure 5:
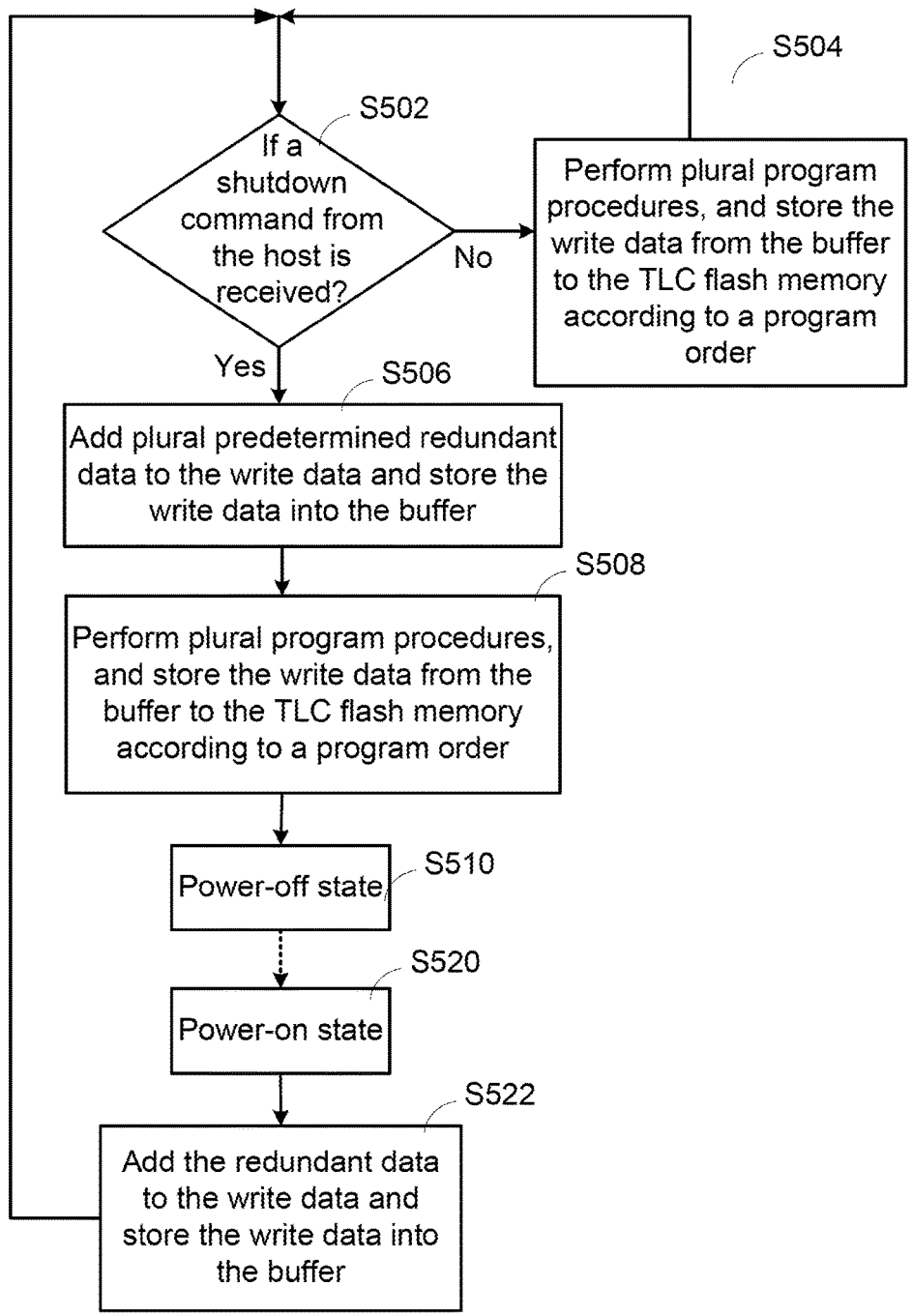
FIG. 5 is a flowchart illustrating a data writing method for a solid state storage device according to an embodiment of the present invention.

As mentioned above, the program order of the TLC flash memory 305 may result in a data loss problem. For solving this problem, the present invention provides a solid state storage device and a data writing method for the solid state storage device. FIG. 5 is a flowchart illustrating a data writing method for a solid state storage device according to an embodiment of the present invention. This flowchart describes the action of the solid state storage device in response to a shutdown command during the write action, and describes the action of the solid state storage device after power restoration. The other operations (e.g., the read action and the erase action) are not redundantly described herein.

Firstly, during normal operation of the solid state storage device 300, the controller 301 judges whether a shutdown command from the host 320 is received (Step S502). If no shutdown command from the host 320 is received by the controller 301, plural program procedures are performed by the controller 301 and the write data in the buffer 307 are stored to the TLC flash memory 305 according to a program order (Step S504).

When the shutdown command from the host 320 is received by the controller 301, the controller 301 adds plural predetermined redundant data to the write data and stores the write data into the buffer 307 (Step S506). Then, plural program procedures are performed by the controller 301, and the write data in the buffer 307 are stored to the TLC flash memory 305 according to the program order (Step S508). When the solid state storage device 300 is in a power-off state (Step S510), the write data temporarily stored in the buffer 307 are lost. In this embodiment, the predetermined redundant data have specified patterns that are automatically generated by the controller 301.

When the solid state storage device 300 is in a power-on state again (Step S520), the redundant data generated before the power-off state are added to the write data by the controller 301 and the write data are stored into the buffer 307 (Step S522). Then, the step S502 is repeatedly done.

FIGS. 6A~6D schematically illustrate the operations of the solid state storage device after the shutdown command is received.

Considering before the shutdown command is received by the solid state storage device 300, the write data stored in the buffer 307 and the TLC flash memory 305 are similar to FIG. 4B. That is, the third page TLC cells and the fourth page TLC cells are not completely programmed, and the write data of the three pages I, K and L are still stored in the buffer 307.

Figure 6A:
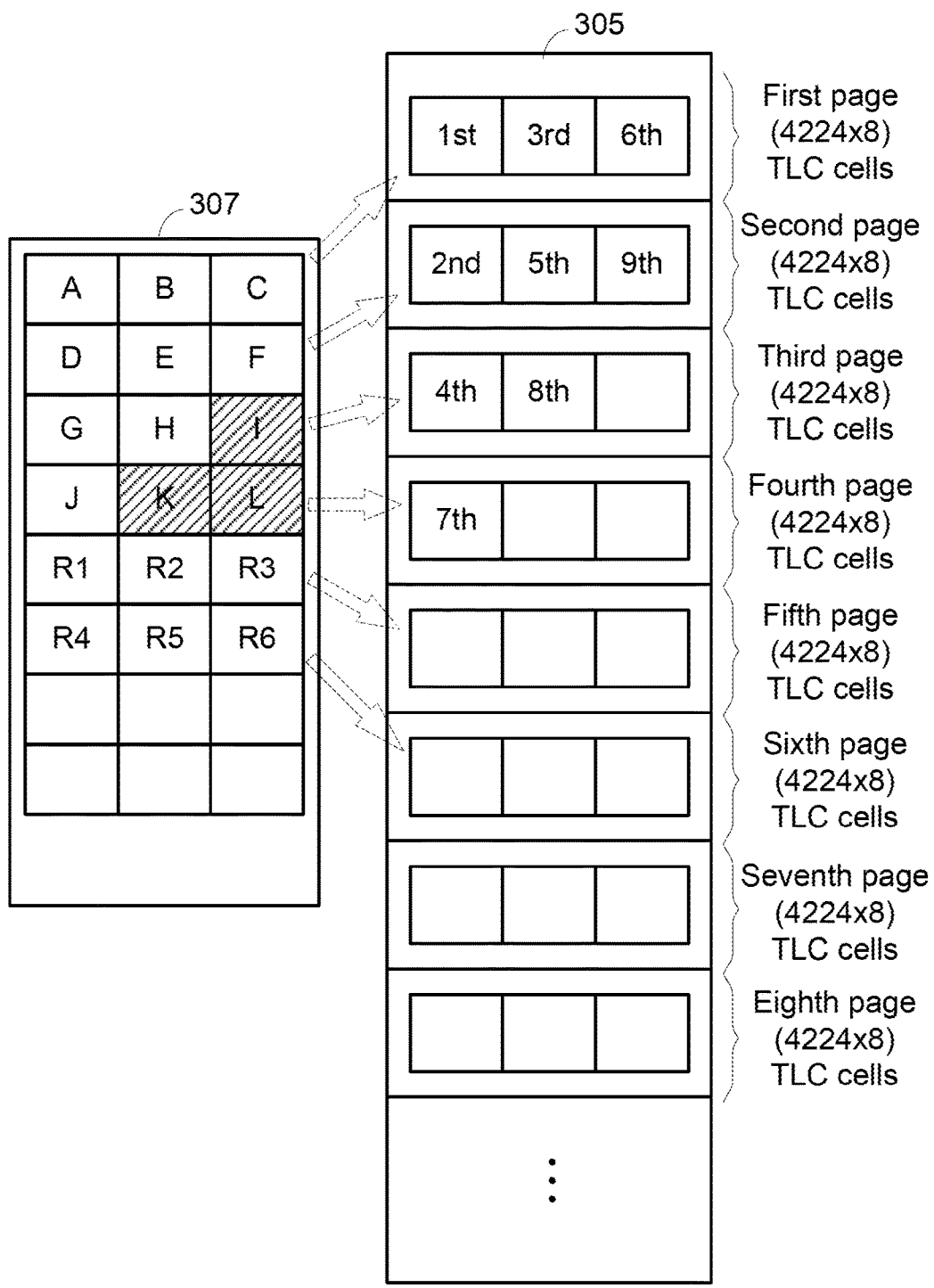
FIGS. 6A-6D schematically illustrate the operations of the solid state storage device after the shutdown command is received by the controller.

When the shutdown command is received by the solid state storage device 300, the controller 301 adds plural predetermined redundant data to the write data and stores the write data into the buffer 307. As shown in FIG. 6A, the controller 301 adds the redundant data R1~R6 to the write data, and temporarily stores the write data into the buffer 307.

Then, plural program procedures are performed by the controller 301, and the write data in the buffer 307 are stored to the TLC flash memory 305 according to the program order. Please refer to FIG. 6B. Then, the fifth page TLC cells are activated by the controller 301, and a tenth program procedure is performed on the upper page of the fifth page TLC cells. Then, the fourth page TLC cells are activated by the controller 301, and an eleventh program procedure is performed on the middle page of the fourth page TLC cells. Then, the third page TLC cells are activated by the controller 301, and a twelfth program procedure is performed on the lower page of the third page TLC cells. Then, the sixth page TLC cells are activated by the controller 301, and a thirteenth program procedure is performed on the upper page of the sixth page TLC cells. Then, the fifth page TLC cells are activated by the controller 301, and a fourteenth program procedure is performed on the middle page of the fifth page TLC cells. Then, the fourth page TLC cells are activated by the controller 301, and a fifteenth program procedure is performed on the lower page of the fourth page TLC cells.

Figure 6B:
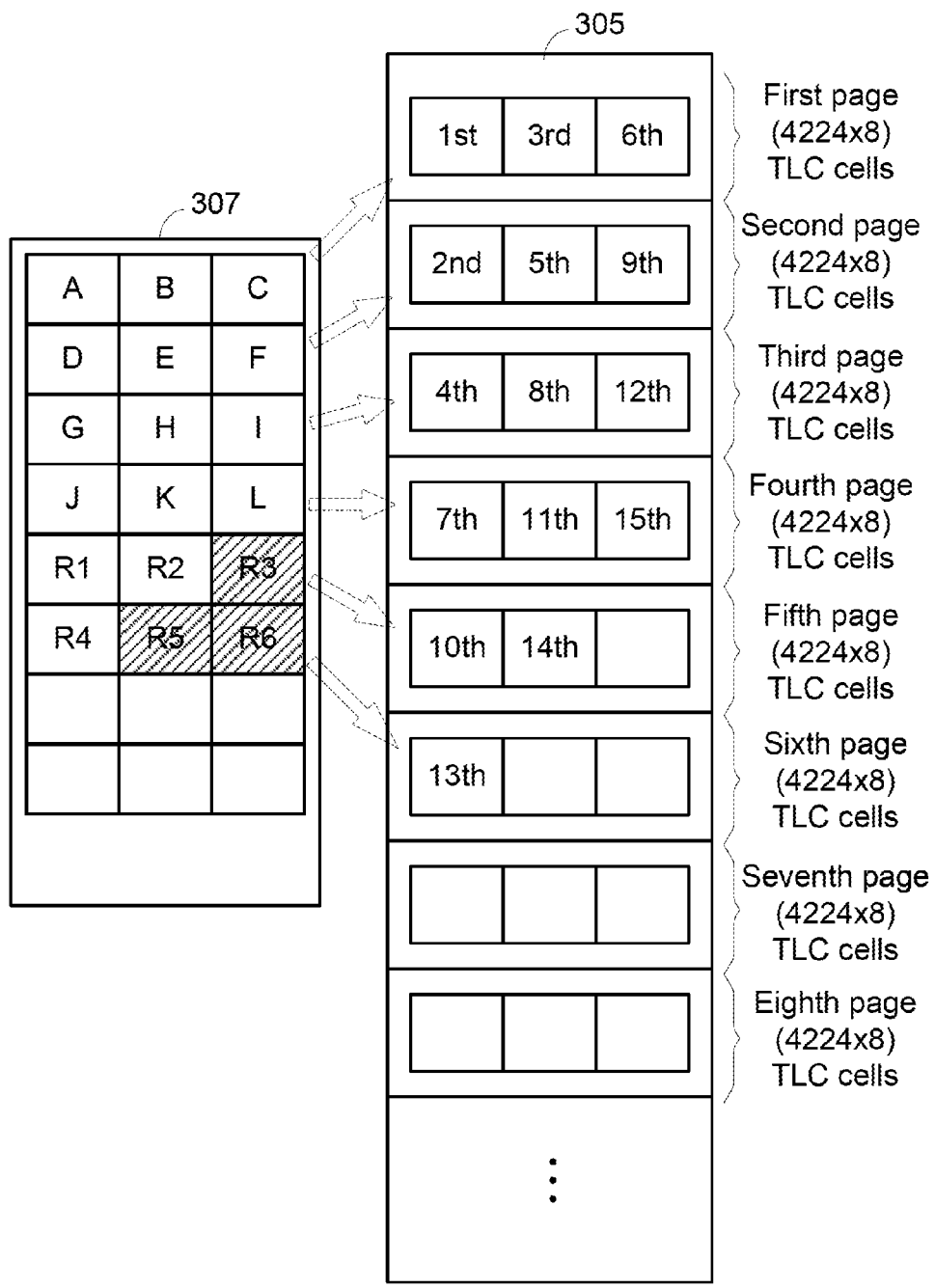

As shown in FIG. 6B, the write data A~L corresponding to the host data from the host 320 have been completely stored in the TLC flash memory 305 before the solid state storage device 300 is in the power-off state. That is, since the first page TLC cells, the second page TLC cells, the third page TLC cells and the fourth page TLC cells have been completely programmed, the data in these cells become stable data.

When the solid state storage device 300 is in the power-off state, the redundant data R3, R5 and R6 are not programmed to the TLC flash memory 305. Consequently, the redundant data R3, R5 and R6 temporarily stored in the buffer 307 are lost when the solid state storage device 300 is in the power-off state.

Figure 6C:
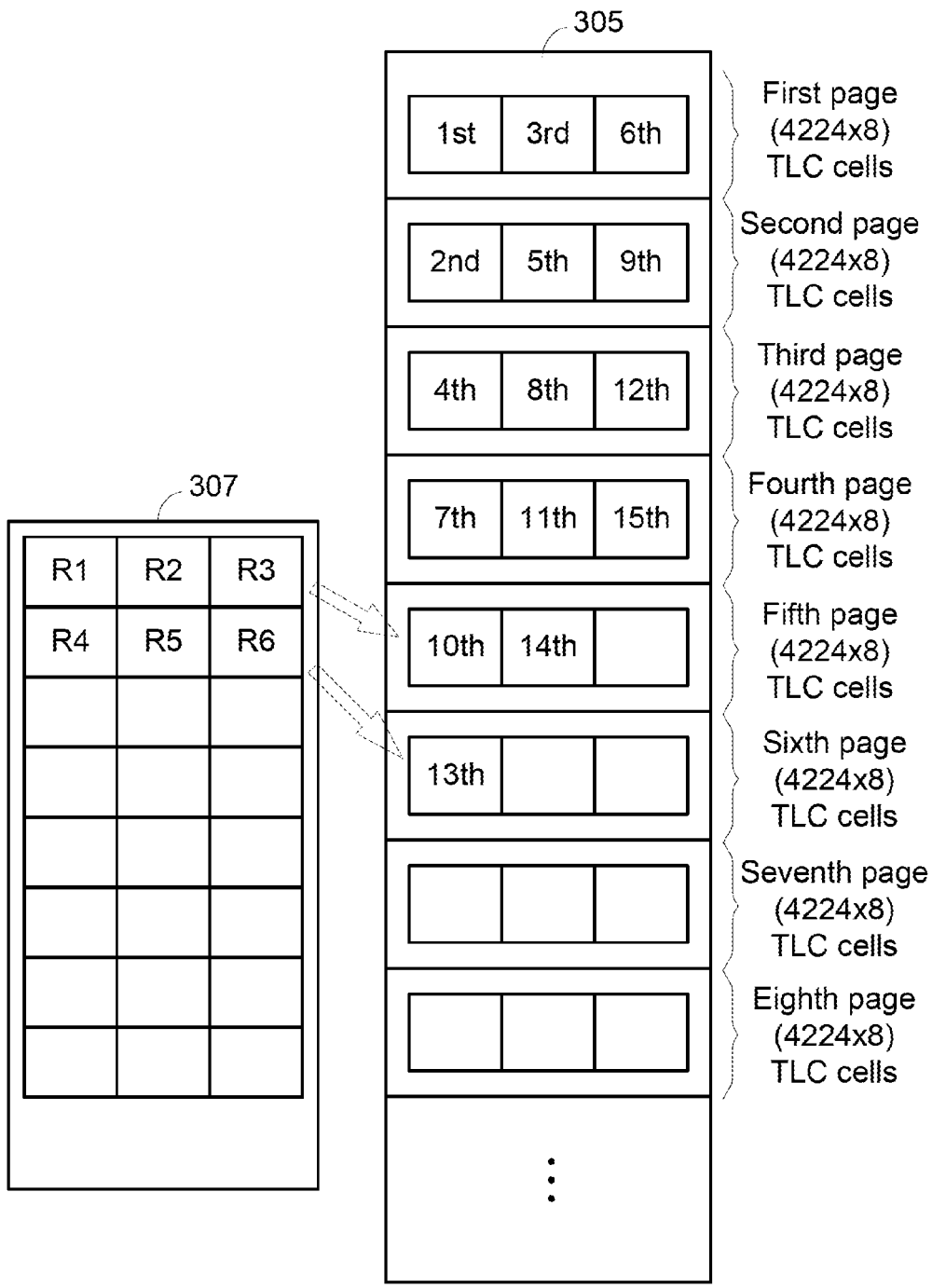

Please refer to FIG. 6C. When the solid state storage device 300 is in the power-on state again, the redundant data generated before the power-off state are added to the write data by the controller 301 and the write data are stored into the buffer 307. That is, when the solid state storage device 300 is in the power-on state again, the controller 301 adds the redundant data R1~R6 to the write data, and temporarily stores the write data into the buffer 307.

Figure 6D:
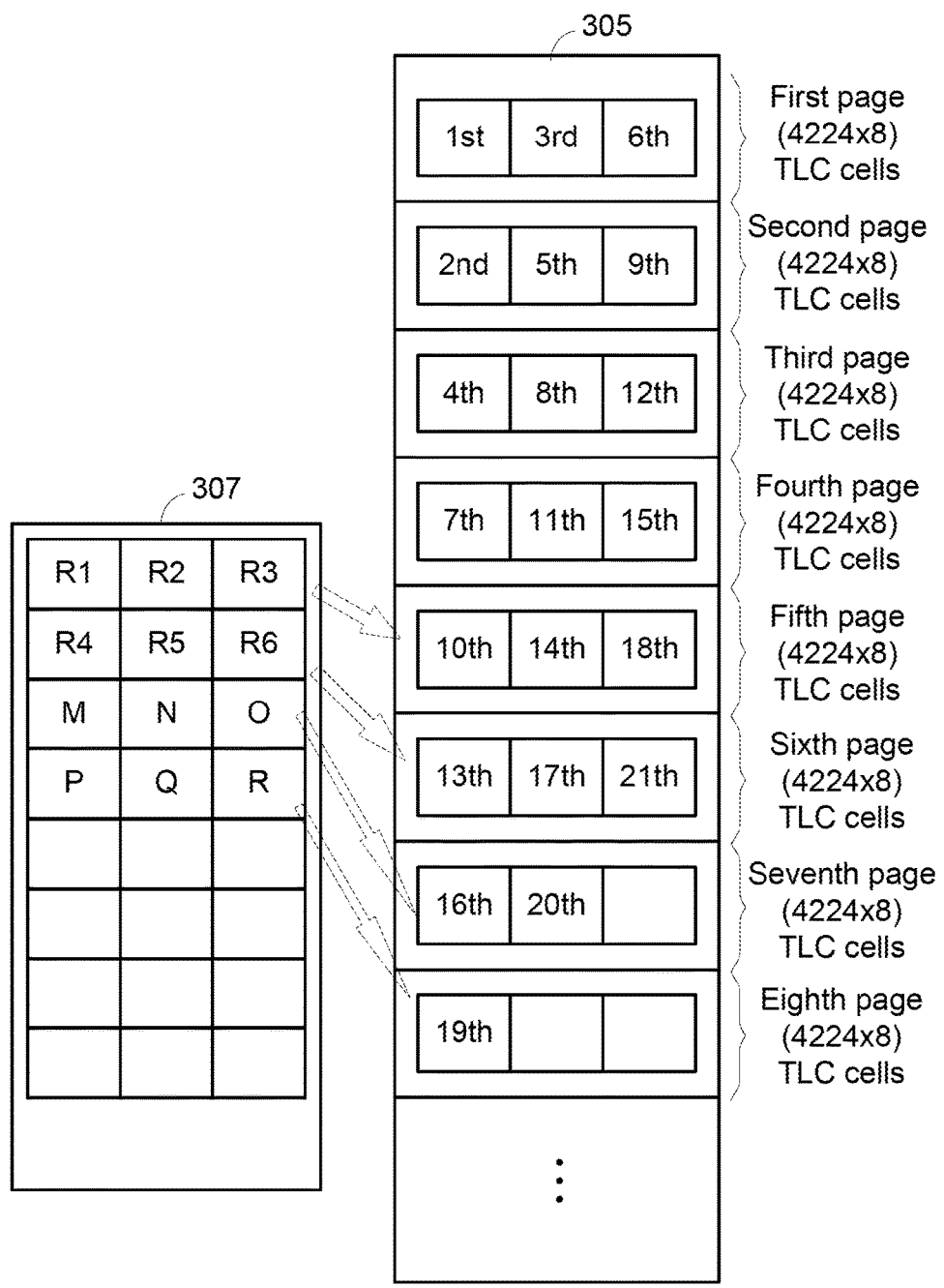

Please refer to FIG. 6D. After new host data are received by the solid state storage device 300 and the ECC encoding operation is performed on the new host data, the write data of 6 pages M~R will be temporarily stored in the buffer 307. Then, plural program procedures are performed by the controller 301, and the write data in the buffer 307 are stored to the TLC flash memory 305 according to the program order.

Please refer to FIG. 6D. Then, the seventh page TLC cells are activated by the controller 301, and a sixteenth program procedure is performed on the upper page of the seventh page TLC cells. Then, the sixth page TLC cells are activated by the controller 301, and a seventeenth program procedure is performed on the middle page of the sixth page TLC cells. Then, the fifth page TLC cells are activated by the controller 301, and an eighteenth program procedure is performed on the lower page of the fifth page TLC cells. Then, the eighth page TLC cells are activated by the controller 301, and a nineteenth program procedure is performed on the upper page of the eighth page TLC cells. Then, the seventh page TLC cells are activated by the controller 301, and a twentieth program procedure is performed on the middle page of the seventh page TLC cells. Then, the sixth page TLC cells are activated by the controller 301, and a twenty first program procedure is performed on the lower page of the sixth page TLC cells.

That is, after the solid state storage device 300 is in the power-on state again, the new write data are continuously stored to the buffer 307. The controller 301 continuously performs the program procedures according to the program order of the TLC flash memory 305. Consequently, the data in the fifth page TLC cells and the sixth page TLC cells become the stable data.

From the above descriptions, the data writing method is used for writing data into at least one page of the flash memory. In other words, the TLC flash memory 305 comprises plural TLC cell groups. Each TLC cell group comprises M TLC cells, and three program procedures are performed on the TLC cell group. After each program procedure is performed, M data are written into the TLC flash memory 305. The M data are correlated with one page of bits. These TLC cell groups comprise plural pages of TLC cells. Moreover, three pages of bits can be written into one page of the TLC cells.

Moreover, the redundant data are generated in a short time period before the solid state storage device 300 is in the power-off state. According to the program order, the host data are encoded into the write data and the write data are stored in the TLC flash memory 305. Consequently, the write data from host are not lost when the solid state storage device 300 is in the power-off state.

After the solid state storage device 300 is in the power-on state again, the controller 301 generates the redundant data again and stores the redundant data into the buffer 307. After the new host data are inputted, the redundant data and encoded host data are stored into the TLC flash memory 305.

Although the redundant data occupy the storage space of the TLC flash memory 305, the data loss problem can be effectively overcome.

Generally, the time period from the generation of the shutdown command to the real power-off state of the solid state storage device 300 is about 100 ms. For example, in case that the data write speed is 200 Mbytes/sec and the data amount of writing data into six pages is 4224×6 bytes.

Consequently, the time period of storing the generated redundant data into the TLC flash memory 305 is about 0.13 ms. Consequently, after the solid state storage device 300 receives the shutdown command, the state storage device 300 has sufficient time to perform the data writing method of the present invention. Even if the state storage device 300 is in the power-off state, the write data stored to the TLC flash memory 305 are not lost.

Although the TLC flash memory is taken as an example to show the data writing method according to the program order of TLC flash memory, more-level cell flash memory can also use the data writing method according to its specified program order. Similarly, by adding the redundant data to the buffer, write data from host are stored in the more-level cell flash memory and are not lost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A data writing method for a solid state storage device, the data writing method comprising steps of:
   (a) judging whether a shutdown command is issued from a host;
   (b) if the shutdown command is not issued from the host, performing plural program procedures, so that plural write data from the host in a buffer are stored to a flash memory according to a program order, wherein the flash memory stores more than 2 bits per cell; and
   (c) if the shutdown command is issued from the host, adding plural predetermined redundant data having specified pattern into the buffer, and performing the plural program procedures, so that the write data that are not stored to the flash memory and the predetermined redundant data in the buffer are stored to the flash memory according to the program order, wherein the predetermined redundant data are irrelevant to the write data from the host.

2. The data writing method as claimed in claim 1, further comprising steps of:
   (d) after the solid state storage device is in a power-on state, adding the plural predetermined redundant data having specified pattern into the buffer before write data from the host are stored into the buffer; and
   (e) repeatedly performing the step (a).

3. The data writing method as claimed in claim 1, wherein the plural predetermined redundant data are generated by the solid state storage device.

4. The data writing method as claimed in claim 1, wherein the flash memory is a triple-level cell flash memory storing 3 bits per cell and comprises plural triple-level cell groups, each triple-level cell group comprises M triple-level cells, three program procedures are performed on the triple-level cell group, and M data are written into the triple-level cell flash memory after each program procedure is performed, wherein the program order comprises steps of:
   (f1) performing a first program procedure of the three program procedures on a specified triple-level cell group;
   (f2) performing a second program procedure of the three program procedures on a preceding triple-level cell group with respective to the specified triple-level cell group; and
   (f3) performing a third program procedure of the three program procedures on a preceding two triple-level cell groups with respect to the specified triple-level cell group.

5. The data writing method as claimed in claim 4, wherein the M data are correlated with one page of bits, each triple-level cell group is correlated with one page of triple-level cells, and three pages of bits are written into one page of the triple-level cells.

6. The data writing method as claimed in claim 4, wherein an upper page of the specified triple-level cell group is programmed in the step (f1), a middle page of the preceding triple-level cell group is programmed in the step (f2), and a lower page of the preceding two triple-level cell groups is programmed in the step (f3).

7. The data writing method as claimed in claim 1, wherein after the write data from the host are stored to the flash memory, part of the plural predetermined redundant data are not stored to the flash memory and the other part of the plural predetermined redundant data are stored to the flash memory.

8. A solid state storage device connected with a host, the solid state storage device comprising:
   a controller connected with the host;
   a buffer connected with the controller; and
   a flash memory connected with the controller,
   wherein if a shutdown command is not issued from the host, the controller performs the plural program procedures, so that the plural write data from the host in the buffer are stored to the flash memory according to a program order,
   wherein when the host issues the shutdown command, the controller adds plural predetermined redundant data having specified pattern into the buffer, wherein the controller performs plural program procedures, so that the write data that are not stored to the flash memory and the predetermined redundant data in the buffer are stored to the flash memory according to the program order, wherein the flash memory stores more than 2 bits per cell, wherein the predetermined redundant data are irrelevant to the write data from the host.

9. The solid state storage device as claimed in claim 8, wherein after the solid state storage device is in a power-on state, the plural predetermined redundant data having specified pattern are added into the buffer before write data from the host are stored into the buffer.

10. The solid state storage device as claimed in claim 8, wherein the flash memory is a triple-level cell flash memory of the solid state storage device comprises plural triple-level cell groups, each triple-level cell group comprises M triple-level cells, three program procedures are performed on the triple-level cell group, and M data are written into the triple-level cell flash memory after each program procedure is performed.

11. The solid state storage device as claimed in claim 10, wherein the program order comprises steps of:
   (f1) performing a first program procedure of the three program procedures on a specified triple-level cell group;
   (f2) performing a second program procedure of the three program procedures on a preceding triple-level cell group with respective to the specified triple-level cell group; and (f3) performing a third program procedure of the three program procedures on a preceding two triple-level cell groups with respect to the specified triple-level cell group.

12. The solid state storage device as claimed in claim 11, wherein the M data are correlated with one page of bits, each triple-level cell group is correlated with one page of triple-level cells, and three pages of bits are written into one page of the triple-level cells.

13. The solid state storage device as claimed in claim 8, wherein after the write data from the host are stored to the flash memory, part of the plural predetermined redundant data are not stored to the flash memory and the other part of the plural predetermined redundant data are stored to the flash memory.

* * * * *